(12) United States Patent
Salles et al.

(10) Patent No.: US 10,041,978 B2
(45) Date of Patent: Aug. 7, 2018

(54) INTEGRATED CIRCUIT WITH INTEGRATED CURRENT SENSOR

(71) Applicants: Alain Salles, Ramonville St Agne (FR); Kamel Abouda, Saint Lys (FR); Patrice Besse, Tournefeuille (FR)

(72) Inventors: Alain Salles, Ramonville St Agne (FR); Kamel Abouda, Saint Lys (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 242 days.

(21) Appl. No.: 14/766,991

(22) PCT Filed: Feb. 15, 2013

(86) PCT No.: PCT/IB2013/000425
§ 371 (c)(1),
(2) Date: Aug. 11, 2015

(87) PCT Pub. No.: WO2014/125317
PCT Pub. Date: Aug. 21, 2014

(65) Prior Publication Data
US 2015/0369845 A1 Dec. 24, 2015

(51) Int. Cl.
*G01R 1/20* (2006.01)
*G01R 15/18* (2006.01)
(Continued)

(52) U.S. Cl.
CPC .............. *G01R 15/18* (2013.01); *G01R 3/00* (2013.01); *G01R 15/181* (2013.01);
(Continued)

(58) Field of Classification Search
CPC ........ G01R 3/00; G01R 15/18; G01R 15/181; G01R 19/0092; G01R 31/2884; H01L 25/06; H01L 25/065
(Continued)

(56) References Cited

U.S. PATENT DOCUMENTS 5,041,780 A   8/1991   Rippel
6,366,770 B1  4/2002   Seshita et al.
(Continued)

OTHER PUBLICATIONS

"PCB Rogowski Coils for High di/dt Current Measurement", Nicolas Karrer and Patrick Hofer-Nose, Published in Power Electronics Specialists Conference, 2000. PESC 00. 2000 IEEE 31st Annual (vol. 3 ), pp. 1296-1301 vol. 3, Meeting Date : Jun. 18, 2000-Jun. 23, 2000 ISSN : 0275-9306.
(Continued)

*Primary Examiner* — Jermele M Hollington
*Assistant Examiner* — Steven Yeninas
(74) *Attorney, Agent, or Firm* — Charlene R. Jacobsen (57) ABSTRACT

An integrated circuit die includes a stack of a substrate and multiple layers extending in parallel to the substrate. A number of integrated electronic components is formed in the stack, and connected to form an electronic circuit. The electronic circuit comprises a first electric contact, a second electric contact, and a coupling which couples the electric strips electrically to each other. The coupling includes a circuit via which extends through at least two of the layers. The die further includes an integrated current sensor having a coil arrangement for sensing a current flowing through a part of the electronic circuit. The coil arrangement is magnetically coupled to the circuit via over at least a part of a length of the circuit via to sensing a magnetic flux through the circuit via. A measurement unit can measure a parameter of the coil arrangement representative of a current flowing through the circuit via.

19 Claims, 6 Drawing Sheets

(51) Int. Cl.
*H01L 25/065* (2006.01)
*G01R 31/28* (2006.01)
*G01R 3/00* (2006.01)
*G01R 19/00* (2006.01)
*H01L 49/02* (2006.01)
*H01L 27/02* (2006.01)

(52) U.S. Cl.
CPC ..... *G01R 19/0092* (2013.01); *G01R 31/2884* (2013.01); *H01L 25/065* (2013.01); *H01L 27/0248* (2013.01); *H01L 28/10* (2013.01); *H01L 2924/0002* (2013.01); *Y10T 29/49009* (2015.01)

(58) Field of Classification Search
USPC ...................................... 324/126, 127, 117 R
See application file for complete search history.

(56) References Cited

U.S. PATENT DOCUMENTS

| | | | |
|---|---|---|---|
| 7,362,086 B2 | 4/2008 | Dupuis et al. | |
| 7,990,132 B2 | 8/2011 | Dupuis et al. | |
| 2003/0067002 A1* | 4/2003 | Fischer | G11C 29/006 257/48 |
| 2003/0137388 A1* | 7/2003 | Meier | G01R 15/186 336/225 |
| 2004/0178875 A1* | 9/2004 | Saito | G01R 15/181 336/200 |
| 2006/0027917 A1 | 2/2006 | Wachter | |
| 2006/0181264 A1 | 8/2006 | Catona et al. | |
| 2009/0128279 A1* | 5/2009 | Matsushita | H01F 17/0033 336/222 |
| 2009/0295368 A1 | 12/2009 | Doogue et al. | |

OTHER PUBLICATIONS

"Using Rogowski coils for transient current measurements" by D. A. Ward and J. La T. Exon, published in Engineering Science and Education Journal (vol. 2, Issue: 3) pp. 105-113 Date of Publication : Jun. 1993—ISSN : 0963-7346.

"Non-Invasive Measurement of Chip Currents in IGBT Modules" Patrick R. Palmer, Bernard H. St a rk, John C. Joyce, Published in: Power Electronics Specialists Conference, 1997. PESC '97 Record., 28th Annual IEEE (vol. 1 ) Date of Conference: Jun. 22-27, 1997—pp. 166-171 vol. 1—ISSN : 0275-9306.

"Rogowski transducers for high bandwidth high current measurement" W F Ray, University of Nottingham, Published in: Low Frequency Power Measurement and Analysis (Digest No. 1994/203), IEE Colloquium—Date of Conference: Nov. 2, 1994—pp. 10/1-10/6—INSPEC Accession No. 4923741.

"An Overview of Integratable Current Sensor Technologies" Chucheng Xiao, Lingyin Zhao, Tadashi Asada, W. G. Odendaal, J. D. van Wyk—Published in: Industry Applications Conference, 2003. 38th IAS Annual Meeting. Conference Record of the (vol. 2 ) Date of Conference: Oct. 12-16, 2003 pp. 1251-1258 vol. 2 Print ISBN: 0/7803-7883-0.

International Search Report and Written Opinion correlating to PCT/IB2013/000425 dated Nov. 20, 2013.

\* cited by examiner

INTEGRATED CIRCUIT WITH INTEGRATED CURRENT SENSOR

FIELD OF THE INVENTION

This invention relates to a multi-layered integrated circuit comprising a current sensor.

BACKGROUND OF THE INVENTION

Palmer, P. R.; Stark, B. H.; Joyce, J. C.; "Noninvasive measurement of chip currents in IGBT modules," Power Electronics Specialists Conference, 1997. PESO '97 Record., 28th Annual IEEE, vol. 1, no., pp. 166-171 discloses a method to measure currents in an IGBT (Insulated Gate Bipolar Transistor). The method uses an external miniature probe consisting of two coils of ten windings each, wound onto a plastic former. The miniature probe is positioned in an IGBT module with multiple IGBTs, with one probe per IGBT to measure the current into the respective IGBT.

However, a disadvantage of the known method is that the probe is not suitable to measure currents inside multi-layered integrated circuits.

SUMMARY OF THE INVENTION

The present invention provides a multi-layered integrated circuit as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the FIGS. are illustrated for simplicity and clarity and have not been drawn to scale.

DETAILED DESCRIPTION OF THE PREFERRED EMBODIMENTS

Because the integrated circuit implementing the present invention is, for the most part, composed of electronic components and circuits known to those skilled in the art, circuit details will not be explained in any greater extent than that considered necessary for the understanding and appreciation of the underlying concepts of the present invention and in order not to obfuscate or distract from the teachings of the present invention.

Figure 1:
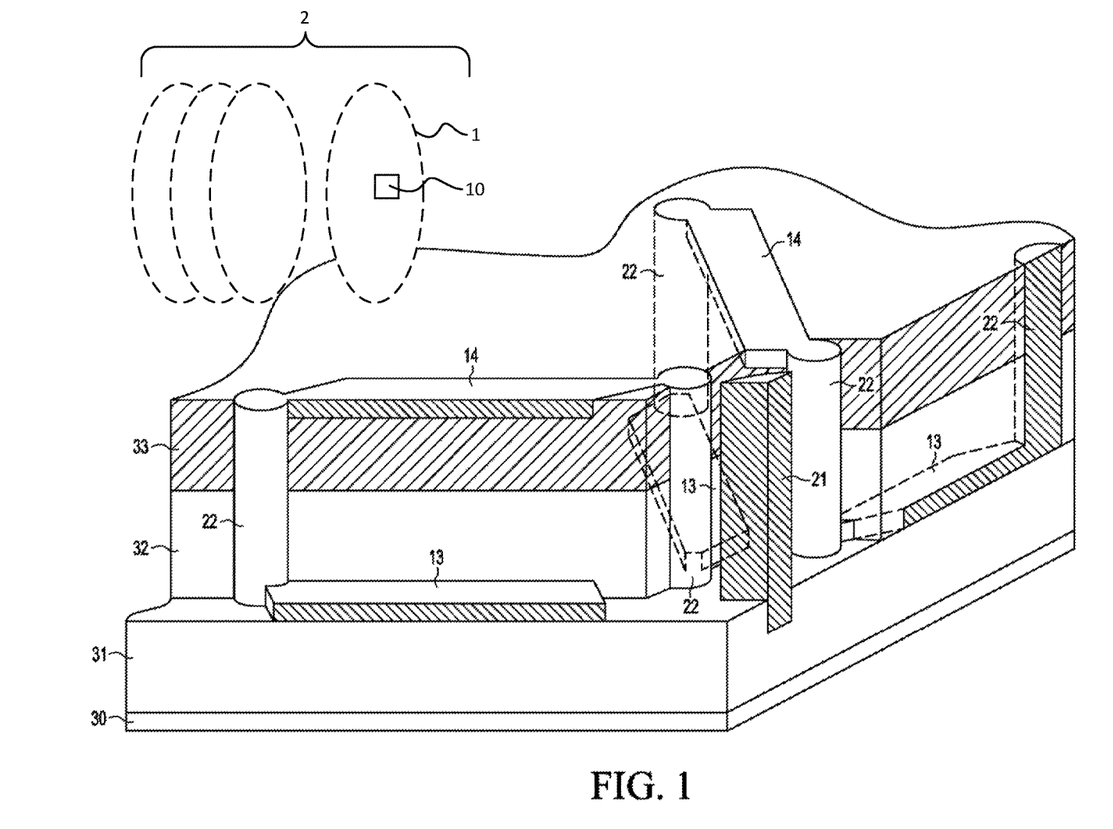
FIG. 1 schematically shows a partially sectional perspective view of part of an example of an integrated circuit with a current sensor.

FIG. 1 schematically shows a partially sectional perspective view of part of an integrated circuit 10 with a current sensor. The integrated circuit 10 may be provided as a bare die or as an packaged integrated circuit which comprises an integrated circuit package and one or more integrated circuit dies provided in the packaged and connectable to the outside of the package through suitable connects.

An integrated circuit 10 is a configuration of electronic components on a single die that forms an electronic circuit, such as a logic circuit and analog or mixed signal circuit. The integrated circuit 10 of FIG. 1 comprises a stack of a substrate 30 and multiple layers 31, 32, 33 extending in parallel to the substrate. The layers 31, 32, 33 are made of semiconductor material, such as silicon and can comprise, e.g., doped regions, implanted ions, insulator elements and electric strips for being able to carry out the various functions an integrated circuit 10 may have. In this example, the integrated circuit 10 comprises three layers 31, 32, 33, but more layers of active electronic components may be integrated both vertically and horizontally into a single integrated circuit 10.

Figure 2:
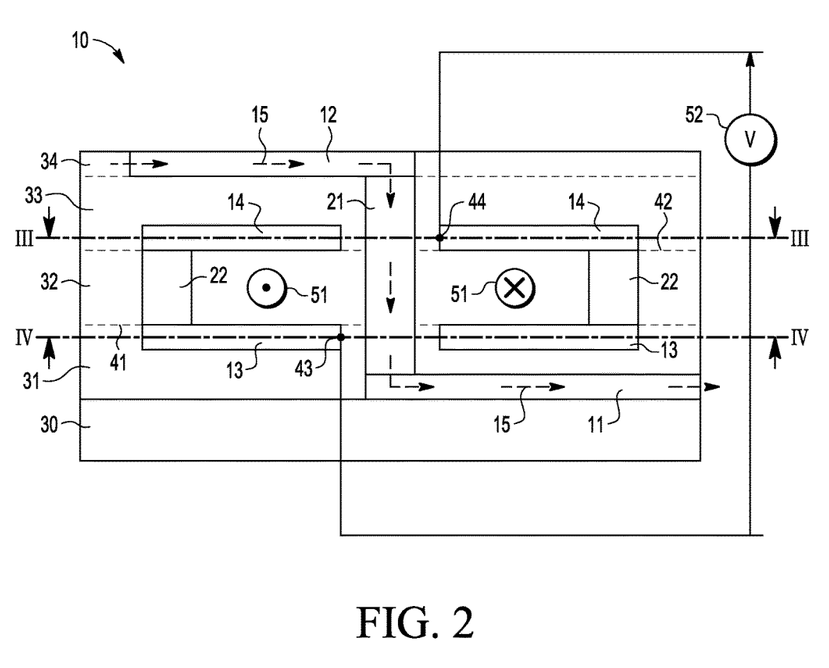
FIG. 2 schematically shows a cross sectional view the example of FIG. 1, taken along the line II-II in FIG. 3.

A number of integrated electronic components (not shown), such as transistors, resistors, capacitors, diodes or otherwise, can be formed in the stack and be connected to form an electronic circuit. As shown in FIG. 2, the electronic circuit can comprise a first electric contact 11 coupled to one or more of the integrated electronic components, and a second electric contact 12 coupled to one or more of the integrated electronic components. The electric strips can be coupled electrically to each other via a coupling which comprises a circuit via 21 which extends through two or more of the layers 31-33. It is to be noted that the circuit via 21 may cross more layers. The circuit via 21 may for example extent through a stack of component layers, of interconnect layers or of a mixture thereof (e.g. the stack comprising at the bottom closest to the substrate one or more component layers and one or more interconnect layers on top thereof, and the circuit via extending through at least one of the component layers and at least one of the interconnect layers)

The integrated circuit die 10 further comprises an integrated current sensor for sensing a current flowing through at least a part of the electronic circuit. The current sensor is provided for, e.g., detecting high dynamic (>1 MHz) currents flowing into the integrated components or for detecting electrostatic discharge (ESD) or electromagnetic interference. With the current sensor integrated on the same die as the other electronic components of the integrated circuit, the currents to be detected can be measured with high accuracy.

The current sensor comprises a coil arrangement 13,14,22 provided in the stack, as explained below in more detail. The coil arrangement is magnetically coupled to the circuit via 21 over at least a part of a length of the circuit via 21 to sense a magnetic flux generated by a current through the circuit via 21. The current sensor is arranged to detect currents 15 running through this circuit via 21 inside the integrated circuit 10. When the electrical current 15 running through the circuit via 21 generates or changes a magnetic field 51 inside the integrated circuit 10, this can be sensed using this magnetic sensor. The galvanic isolation between the sensor (metal elements 13, 14 and sensor vias 22) and the current path (metal elements 11, 12 and circuit via 21) limit the disturbance that other types of current sensors may encounter.

Figure 3:
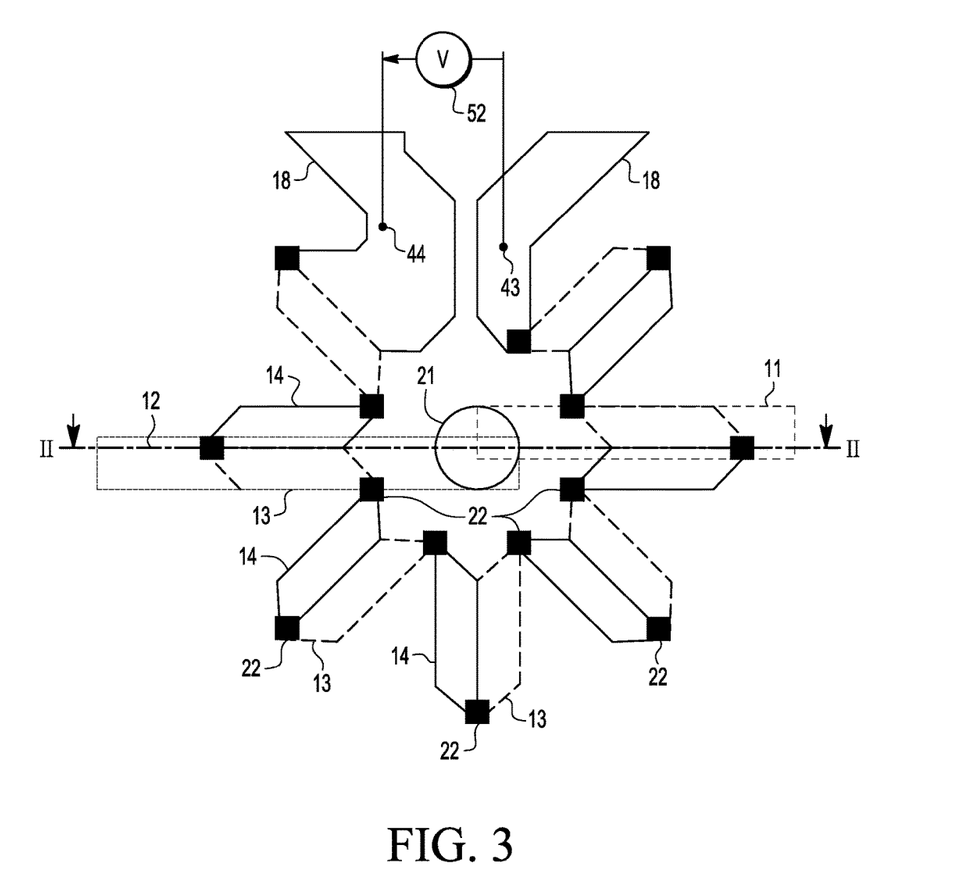
FIG. 3 schematically shows a sectional view of the example of FIG. 1, taken along the line III-III in FIG. 2.
Figure 4:
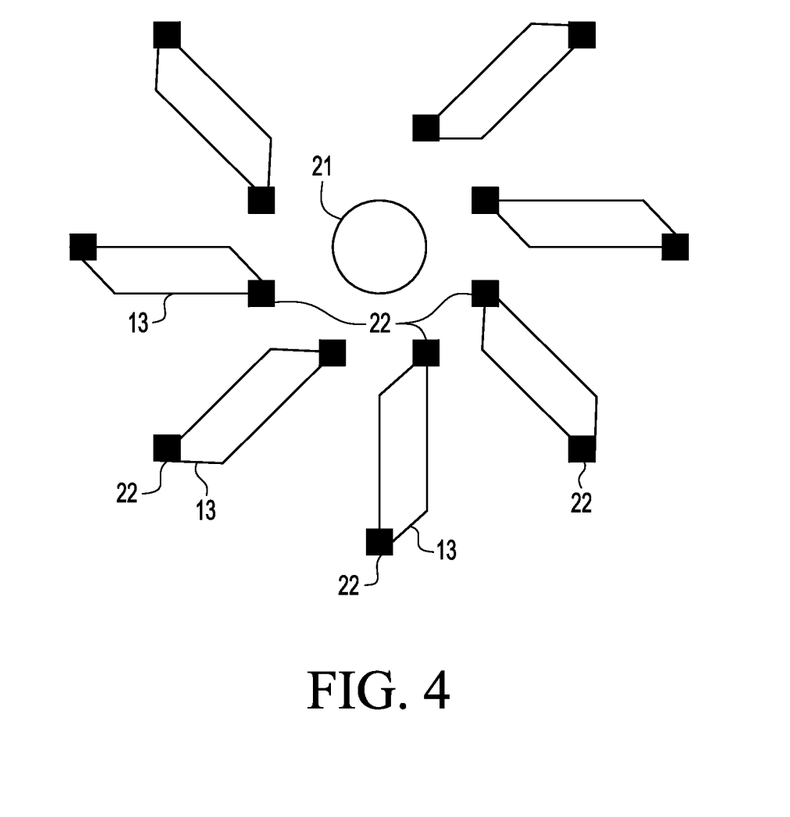
FIG. 4 schematically shows a sectional view of elements of the example of FIG. 1, taken along the line IV-IV in FIG. 2.
Figure 5:
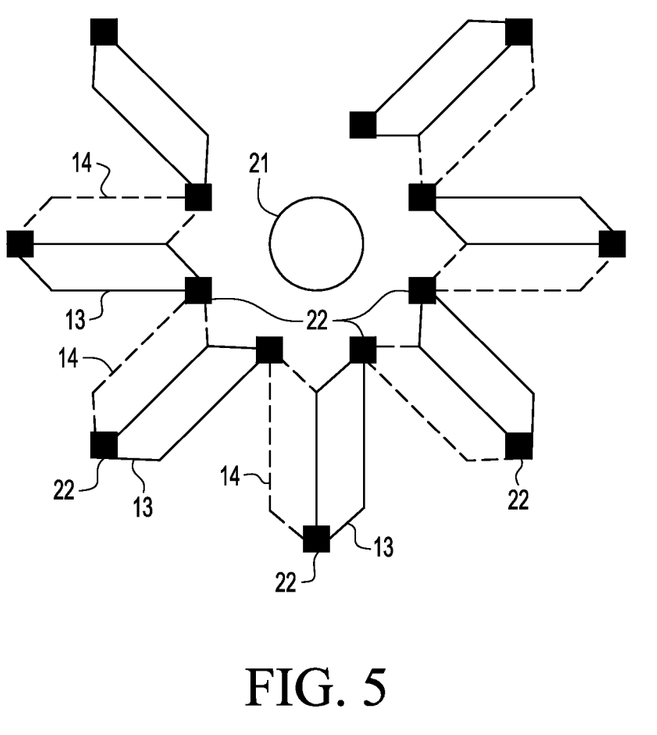
FIG. 5 schematically shows the same view as FIG. 4, but with hidden elements indicated with dashed lines.

As shown in FIGS. 2 and 3, a measurement unit 52 can be connected to the coil arrangement to measure a parameter of the coil arrangement, e.g. the voltage difference between two different points or the current flowing through the coil arrangement, representative of a current flowing through the circuit via. In the shown example, the voltage that is induced in the coil is proportional to the rate of change (derivative) of current in the circuit via 21, and the measurement unit 52 is a voltage meter suitably connected to measure the voltage difference between the beginning and the end of the coil, as respectively indicated with points 43,44 in the FIGS.

It will be apparent that the parameter sensed by the integrated current sensor may be treated before or after being received by the measurement unit 52. The integrated circuit die 10 may for example further comprise an integrator for integrating the voltage.

The coil arrangement can be any arrangement suitable for the specific implementation. In the example of FIG. 1, the coil is a curved coil which operates as a Rogowski coil. The curved coil extends along a path curved around the longitudinal axis of the circuit via 21 over at least a part of the circumference of the circuit via 21. In this example, the path is in a plane perpendicular to the longitudinal axis. The coil encloses the circuit via 21 in circumferential direction and forms a loop around the circuit via 21.

The coil comprises several windings, and has a torroidal helix like shape. From FIG. 3, it can be seen how an electrically conductive path is present that runs through an electric strip 13 in the first plane 41 to a sensor via 22, to a electric strip 14 in the second plane 42, to another sensor via 22, to a further electric strip 13 in the first plane 41 and so on, thus having several windings. At the outer ends of the coil arrangements two metal pads 18 are coupled to electric strips 13, 14 in the first and/or second plane 41, 42. The voltage measurement unit 52 is coupled to these metal pads 18. In this example, the metal pads 18 are placed in the same planes 41, 42 as the electric strips 13, 14 they are coupled to, however they may be placed in a different plane and e.g. be coupled through further vias to the other electric strips 13, 14. The two metal pads 18 may be placed at different depths inside the integrated circuit 10.

The coil arrangement comprises a first plurality of electric strips 13 distributed around the circuit via 21 in a first plane 41, the first plane being non-parallel to a longitudinal axis of the circuit via. The arrangement further has a second plurality of electric strips 14 distributed around the via 21 in a second plane 42, the second plane being non-parallel to the longitudinal axis of the circuit via, the second plane 42 being in a longitudinal direction of the circuit via at a distance from the first plane 41. A plurality of sensor vias 22 is present. Each sensor via 22 electrically couples an electric contact 13 of the first plurality to a electric contact 14 of the second plurality in such a way that the first plurality of electric strips 13, the second plurality of electric strips 14 and the sensor vias 22 together form a winding of the coil arrangement. Although the shown example has less than ten windings, more specifically eight, it has been found that this allows a simple yet sensitive sensor to be obtained.

In the shown example, the first and second planes 41,42 are separated by a single layer 32. However, the first plane 41 and the second plane 42 may be separated by more than one layer. It is also possible to use a third and fourth, or even more, planes with electric strips for constituting the coil arrangement As can be seen in FIGS. 2 and 3, each winding comprises an electronically conducting, e.g metal, first strip 13 in a first plane 31 which extends in radial direction of the coil (and of the circuit via), from an inner circumference of the coil to an outer circumference of the coil. The winding further comprises an electronically conducting, e.g metal, second strip 14 in a second plane 33 above the first plane which extends in radial direction of the coil (and of the circuit via), from an inner circumference of the coil to an outer circumference of the coil.

The strips 13,14 may be provided in metallization layers. In such case, the layers 31-33 may comprise a sub-stack of dielectric layers in which two or more metallization layers are patterned, each of the metallization layers comprises one or more interconnects for integrated electronic components, and the coil arrangement comprises one or more first metal path extending in one of the metallization layers and a second metal path extending in another of the metallization layers, the metal paths being electrically isolated from the one or more interconnect.

As show, and particularly derivable from FIG. 3, the windings are spaced in tangential direction, and the windings are arranged in a radial pattern. The strips 13,14 of the arrangement are arranged in a star-like pattern, which zigzags in a radial direction between a distal point and a proximal point (relative to a longitudinal axis of the circuit via 21).

The first strip 13 and the second strip 14 are connected to each other at a distal end (with respect to the circuit via 21), in this example through a sensor via 22 extending through the layers separating the first and second strip. The first strip 13 is further connected to a second strip of a preceding winding at a proximal end (with respect to the circuit via 21) in this example through a sensor via 22 extending through the layers between the first and second strip 13,14. The second strip 14 is further connected to a first strip 13 of a following winding at a proximal end (with respect to the circuit via 21), in this example through a sensor via 22 extending through the layers between the first and second strip 13,14.

As shown, the first strip 13 and the second strip 14 are positioned in circumferential direction (of the circuit via 21) adjacent to each other. In the FIGS., the strips have no overlap thereby reducing the capacitive effects. However, the drawings represent an idealized case, in an actual implementation some overlap may be present. The integrated circuit die 10 thus comprises a first radial pattern (of the first strips) and a second radial pattern (of the second strips) separated from the first radial pattern by one of more of the layers 31-33, i.e. positioned in the longitudinal direction of the circuit via at a distance from the first radial pattern. The strips of the first radial pattern are, in a circumferential direction of the circuit via, interdigitated between the strips of the second radial pattern.

The integrated circuit can be used in a method of manufacturing electronic circuits. The method may for example comprises manufacturing a multiple of integrated circuits using a set of wafers (2 of FIG. 1). Of one or more wafers (1 of FIG. 1), one or more integrated circuit dies provided with an integrated current sensor comprising a coil arrangement may be manufactured. The integrated current sensor of the integrated circuit die may then be used to perform tests of one or more of: the electronic circuit of the integrated circuit die, the wafer 1 provided with the integrated circuit die, other wafers of the set 2.

Figure 6:
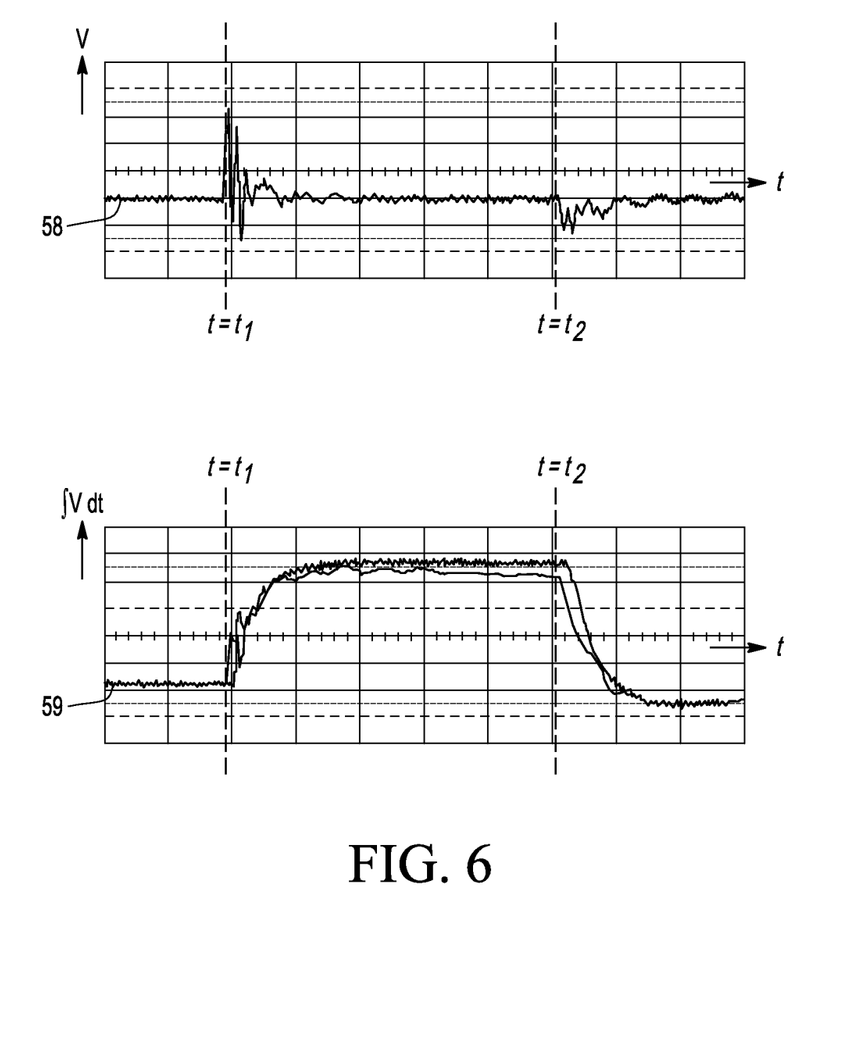
FIG. 6 shows exemplary signals obtained by the example of FIG. 1.

FIG. 6 shows exemplary signals 58, 59 obtained by the current sensor of FIGS. 1-5. The upper diagram shows an exemplary course of the signal 58 measured by voltage measurement unit 52. At $t=t_1$ a 100 ns TLP (Transmission Line Pulse) current 15 is injected into the integrated circuit. The magnetic fields 51 caused by this current 15 are detected by the integrated magnetic sensor. The voltage 58 shows a clear peak when the current suddenly increases ($t=t_1$) and a less clear peak when it decreases (t=t$_2$). In between t$_1$ and t$_2$, the constant current through the circuit via 21 does not change the magnetic field 51 and no sensor signal 58 does not show a significant amplitude. The exemplary sensor signal 58 in the upper diagram shows that the current sensor is indeed capable of detecting currents 15 running through the circuit via 21.

In the lower diagram, a signal 59 is shown which is obtained by integrating the signal from the voltage measurement unit 52 over time. The integration may be performed computationally, based on the signal values 58 from the upper diagram. Alternatively, the integration may be performed electronically using a voltage integrator.

In the foregoing specification, the invention has been described with reference to specific examples of embodiments of the invention. It will, however, be evident that various modifications and changes may be made therein without departing from the scope of the invention as set forth in the appended claims, and that the claims are not limited to the specific examples described hereinabove. For example, the connections may be an type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An integrated circuit die, comprising:
   a stack of a substrate of the integrated circuit die and multiple layers of the integrated circuit die extending in parallel to the substrate;
   a number of integrated electronic components formed in the stack, and connected to form an electronic circuit of the integrated circuit die;
   the electronic circuit comprising a first electric contact coupled to at least one of said integrated electronic components, a second electric contact coupled to at least one of said integrated electronic components, and a coupling which couples said electric strips electrically to each other, said coupling comprising a circuit via which extends through at least two of said layers;
   the integrated circuit die further comprising an integrated current sensor for sensing a current flowing through at least a part of said electronic circuit, the current sensor comprising a coil arrangement provided in said stack, which coil arrangement is magnetically coupled to the circuit via over at least a part of a length of the circuit via to sense a magnetic flux generated by a current through the circuit via, and a measurement unit for measuring a parameter of said coil arrangement representative of a current flowing through said circuit via.

2. The integrated circuit die as claimed in claim 1, wherein said coil is a curved coil, the curved coil extending along a path curved around a longitudinal axis of the circuit via over at least a part of the circumference of the circuit via, and wherein the measurement unit is a voltage measurement unit for measuring a voltage between a first point and a second point in the curved coil.

3. The integrated circuit die as claimed in claim 2, wherein the coil arrangement comprises a toroidal helix.

4. The integrated circuit die as claimed in any one claim 1, further comprising an integrator for integrating the voltage.

5. The integrated circuit die as claimed in claim 1, wherein the coil arrangement zig-zags in a radial direction relative to a longitudinal axis of the circuit via.

6. The integrated circuit die as claimed in claim 1, wherein the coil arrangement comprises:
   a first plurality of electric strips distributed around the circuit via in a first plane, the first plane being non-parallel to a longitudinal axis of the circuit via;
   a second plurality of electric strips distributed around the via in a second plane, the second plane being non-parallel to the longitudinal axis of the circuit via, the second plane being in a longitudinal direction of said circuit via at a distance from the first plane;
   a plurality of sensor vias, each sensor via electrically coupling an electric contact of the first plurality to an electric contact of the second plurality in such a way that the first plurality of electric strips, the second plurality of electric strips and the sensor vias together form the coil arrangement.

7. The integrated circuit die as claimed in claim 1, wherein the coil arrangement comprises: a number of longitudinal, electrically conducting, elements arranged in a radial pattern around said circuit via.

8. The integrated circuit die as claimed in claim 7, comprising a first radial pattern and a second radial pattern positioned in the longitudinal direction of the circuit via at a distance from the first radial pattern, and the elements of the first radial pattern being, in a circumferential direction of said circuit via, interdigitated between the elements of the second radial pattern.

9. The integrated circuit die as claimed in claim 1, wherein the layers comprise a sub-stack of dielectric layers in which at least two metallization layers are patterned, each of said metallization layers comprising at least one interconnect for integrated electronic components, and the coil arrangement comprises at least one first metal path extending in one of said metallization layers and a second metal path extending in another of said metallization layers, said metal paths being electrically isolated from the at least one interconnect.

10. A packaged integrated circuit component, comprising: an integrated circuit package and an integrated circuit die as claimed in claim 1 provided in said package.

11. The integrated circuit die of claim 1, wherein the multiple layers are formed of semiconductor material.

12. The integrated circuit die of claim 11, wherein the semiconductor material includes doped semiconductor material.

13. The integrated circuit die of claim 11, wherein the semiconductor material includes silicon.

14. A method of manufacturing an electronic circuit of an integrated circuit die derived from a wafer, comprising:
- forming a stack of a substrate and multiple layers extending in parallel to the substrate, the substrate and multiple layers comprising a wafer;
- forming a number of integrated electronic components in the stack to form an electronic circuit, the electronic circuit having a first electric contact coupled to at least one of said integrated electronic components, a second electric contact coupled to at least one of said integrated electronic components, and a coupling which couples said electric strips electrically to each other, said coupling having a circuit via which extends through at least two of said layers,
- forming an integrated current sensor for sensing a current flowing through at least a part of said electronic circuit, the current sensor having a coil arrangement provided in said stack, which coil arrangement is magnetically coupled to the circuit via over at least a part of a length of the circuit via to sense a magnetic flux generated by a current through the circuit via; and
- forming a measurement unit for measuring a parameter of said coil arrangement representative of a current flowing through said circuit via.

15. The method of claim 14, wherein the multiple layers are formed of semiconductor material.

16. A method comprising:
- in an integrated circuit die having a stack of a substrate and multiple layers extending in parallel to the substrate; a number of integrated electronic components formed in the stack, and connected to form an electronic circuit having a first electric contact coupled to at least one of said integrated electronic components, a second electric contact coupled to at least one of said integrated electronic components, and a coupling which couples said electric strips electrically to each other, said coupling having a circuit via which extends through at least two of said layers,
- sensing a current flowing with an integrated current sensor through at least a part of said electronic circuit, the current sensor comprising a coil arrangement provided in said stack, wherein the coil arrangement is magnetically coupled to the circuit via over at least a part of a length of the circuit via to sense a magnetic flux generated by a current through the circuit via; and
- measuring a parameter of said coil arrangement using a measurement unit, said parameter representative of a current flowing through said circuit via.

17. The method of claim 16, further comprising using the integrated current sensor to perform tests of the electronic circuit of the integrated circuit die.

18. The method of claim 16, wherein the integrated circuit is part of a wafer, and the method further comprises using the integrated current sensor to perform tests of the wafer.

19. The method of claim 18, wherein the wafer is part of a set of wafers, and the method further comprises using the integrated current sensor to perform tests of another wafer of the set of wafers.

* * * * *